(12) United States Patent
Huang et al.

(10) Patent No.: US 10,637,001 B2
(45) Date of Patent: *Apr. 28, 2020

(54) THIN-FILM ENCAPSULATION STRUCTURE OF FLEXIBLE PANEL HAVING OPPOSITE HYDROPHILIC/HYDROPHOBIC ARRANGEMENT

(71) Applicant: Wuhan China Star Optoelectronics Semiconductor Display Technology Co., Ltd., Wuhan, Hubei (CN)

(72) Inventors: Jing Huang, Guangdong (CN); Hsiang Lun Hsu, Guangdong (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/128,377

(22) Filed: Sep. 11, 2018

(65) Prior Publication Data

US 2019/0312226 A1 Oct. 10, 2019

Related U.S. Application Data

(63) Continuation of application No. PCT/CN2018/091541, filed on Jun. 15, 2018.

(30) Foreign Application Priority Data

Apr. 4, 2018 (CN) .......................... 2018 1 0295363

(51) Int. Cl.
*H01L 51/52* (2006.01)
*H01L 51/56* (2006.01)
*H01L 51/00* (2006.01)

(52) U.S. Cl.
CPC ...... *H01L 51/5253* (2013.01); *H01L 51/0097* (2013.01); *H01L 51/56* (2013.01); *H01L 2251/5338* (2013.01)

(58) Field of Classification Search
CPC ............. H01L 51/5253; H01L 51/5256; H01L 51/0097
See application file for complete search history.

(56) References Cited

U.S. PATENT DOCUMENTS

2006/0022579 A1 2/2006 Wang et al.
2016/0268547 A1* 9/2016 Kim .................... H01L 51/5256
(Continued)

FOREIGN PATENT DOCUMENTS

CN 103187455 A 7/2013
CN 105206620 A 12/2015
(Continued)

OTHER PUBLICATIONS

Chinese Office Action issued in corresponding Chinese Application No. 201810295363.0, dated Mar. 6, 2019, pp. 1-8, Beijing, China.

*Primary Examiner* — Quoc D Hoang
(74) *Attorney, Agent, or Firm* — Leong C. Lei

(57) ABSTRACT

The present invention relates to a flexible OLED panel, thin-film encapsulation structure of flexible panel and encapsulation method for the same. The present invention includes a first inorganic layer, a first organic layer and a second inorganic layer structure, wherein the first organic layer is prepared by using hexamethyldisiloxane which is an organic material to form the first retaining wall. The hydrophilicity/hydrophobicity between the first retaining wall and the first organic layer is oppositely disposed such that the surface of the first retaining wall and the first organic layer do not mutually dissolve when contacted. The feature can greatly reduce the thickness of the at least one retaining wall. While ensuring that the flexible panel display region is shielded (Continued)

from external water oxygen, covering the particle contaminant of the flexible panel, buffering the stress during bending and folding, and the present invention has more simplified and more reliable features.

6 Claims, 3 Drawing Sheets

(56) References Cited

U.S. PATENT DOCUMENTS

2017/0229526 A1* 8/2017 Zhang .................. H01L 27/307
2018/0097198 A1* 4/2018 Chou .................. H01L 51/5253
2019/0267570 A1* 8/2019 Huang ................ H01L 51/5253

FOREIGN PATENT DOCUMENTS

| CN | 106816456 A | 6/2017 |
| CN | 106848107 A | 6/2017 |
| CN | 106981584 A | 7/2017 |
| CN | 107623086 A | 1/2018 |
| CN | 107799665 A | 3/2018 |
| KR | 10-1255537 B1 | 4/2013 |

* cited by examiner

THIN-FILM ENCAPSULATION STRUCTURE OF FLEXIBLE PANEL HAVING OPPOSITE HYDROPHILIC/HYDROPHOBIC ARRANGEMENT

CROSS-REFERENCE TO RELATED APPLICATION

This application is a continuing application of PCT Patent Application No. PCT/CN2018/091541, entitled "FLEXIBLE OLED PANEL, THIN-FILM ENCAPSULATION STRUCTURE OF FLEXIBLE PANEL AND ENCAPSULATION METHOD FOR THE SAME", filed on Jun. 15, 2018, which claims priority to China Patent Application No. CN201810295363.0 filed on Apr. 4, 2018, both of which are hereby incorporated in its entireties by reference.

FIELD OF THE INVENTION

The present invention relates to an OLED display manufacturing field, and more particularly to a flexible OLED panel, thin-film encapsulation structure of flexible panel and encapsulation method for the same.

BACKGROUND OF THE INVENTION

With the increasing market demand for the third-generation display technology, the development and production of flexible OLEDs has become a hot area for the display industry. Wherein, the flexible encapsulation technology is directly related to the display life of OLED, which is one of the bottlenecks restricting the development of OLED. Currently, the flexible encapsulation mainly adopts a laminated structure of an inorganic layer-organic layer-inorganic layer, and the flexible encapsulation requires not only fully resisting the erosion of external water and oxygen, but also effectively covering particle contaminant, buffer bending, and the stress in the folding process which are unavoidable in the production process. For the inorganic layer, it is mainly used to block the erosion of external water and oxygen; while the organic layer is mainly used to cover the particle contaminant, buffer bending and stress during the folding process, which is unavoidable in the production process. Therefore, the organic layer is also called organic buffer layer.

The organic buffer layer in the encapsulation structure is usually realized by a technique such as flash distillation, inkjet printing (IJP), in which the inkjet printing method is shorter in process time and excellent in planarization effect. However, the material for preparing the organic layer is good in the fluidity and the boundary is not easy to control. Usually, a retaining wall (dam) is made outside the display region to block the uncontrollability of the ink boundary. Since the retaining wall is usually obtained by using the same metal mask in the preparation of the planarization layer and the pixel definition layer, the material of the retaining wall is an organic material, water vapor is easily penetrated, and in order to completely block the overflow of the organic layer material, at least two retaining walls are generally produced.

More importantly, if the material of the organic layer is hydrophilic and the material of the retaining wall is also hydrophilic, or the material of the organic layer is hydrophobic and the material of the retaining wall is also hydrophobic, the same hydrophilic/hydrophobic material in organic layer and the retaining wall will generate a surface mutual solubility, which will have a greater impact on the barrier effect of the retaining wall. It is necessary to increase the thickness of the retaining wall or provide a multi-layer retaining wall to achieve a better blocking function. Further, the boundary width of the outermost inorganic layer at the time of preparation is affected, at least the edge of the outermost retaining wall is required to ensure that the edge does not corrode by the water and oxygen quickly, which is disadvantageous for the design of the narrow frame.

SUMMARY OF THE INVENTION

The object of the present invention is to provide a thin-film encapsulation structure with simple structure and compactness, and provide the following technical solutions:

A thin-film encapsulation structure of a flexible panel, comprising: a first inorganic layer, a first organic layer, and a second inorganic layer which are sequentially laminated; and a first retaining wall, herein the first inorganic layer covers on the flexible panel; wherein the number of the first retaining wall is at least one, the first retaining wall is made of hexamethyldisiloxane, and the at least one first retaining wall is disposed at a peripheral of the first organic layer; and wherein the second inorganic layer covers the first organic layer and the first retaining wall.

Wherein when the first organic layer is a hydrophilic material, a surface of the first retaining wall is hydrophobic; when the first organic layer is a hydrophobic material, a surface of the first retaining wall is hydrophilic.

Wherein the first retaining wall is disposed on the first inorganic layer

Wherein the second inorganic layer and the first inorganic layer are contacted.

Wherein the flexible panel further includes at least one second retaining wall, a material of the second retaining wall is polyimide and the second retaining wall is covered by the first inorganic layer.

The present invention also relates to a thin-film encapsulation method of a flexible panel, comprising following steps: manufacturing a first inorganic layer on a flexible panel; manufacturing a first retaining wall on a periphery of a display region of the flexible panel, and a material of the first retaining wall is hexamethyldisiloxane; manufacturing a first organic layer in the display region of the flexible panel such that the first organic layer is received in a receiving cavity surrounded by the first retaining wall; and manufacturing a second inorganic layer to cover the first retaining wall and the first organic layer.

Wherein when manufacturing the first retaining wall at the peripheral of the display region, controlling a gas ratio in the chemical deposition process according to hydrophilic-hydrophobic property of material of the first organic layer to be printed to obtain the first retaining wall having a surface with hydrophobic-hydrophilic property different from the hydrophilic/hydrophobic material.

Wherein before manufacturing the first inorganic layer, manufacturing a second retaining wall, and a material of the second retaining wall is polyimide; wherein the first inorganic layer is manufactured at a peripheral of the second retaining wall.

Wherein when manufacturing the first retaining wall at the peripheral of the display region using a chemical deposition, using another material to manufacture a third retaining wall.

Wherein the first inorganic layer is manufactured by a deposition method, the first retaining wall is manufactured by a chemical deposition method, and the first organic layer is manufactured by an inkjet printing method, and the second inorganic layer is manufactured by a chemical deposition method.

The thin-film encapsulation structure of the present invention adopts the traditional inorganic layer-organic layer-inorganic layer structure, and realizes blocking the erosion of external water and oxygen, particle contamination, buffering the stress in bending and folding process. More importantly, by the hydrophilic/hydrophobic opposite arrangement between the first retaining wall and the first organic layer, when the surface of the first retaining wall and the first organic layer are contact, a mutual dissolution will not generate, which can greatly reduce the thickness of the first retaining wall, and has a more simplified and reliable retaining wall structure compared with the conventional retaining wall structure, which helps to further narrow the frame of the display region of the flexible OLED panel and improve user experience.

DETAILED DESCRIPTION OF PREFERRED EMBODIMENTS

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
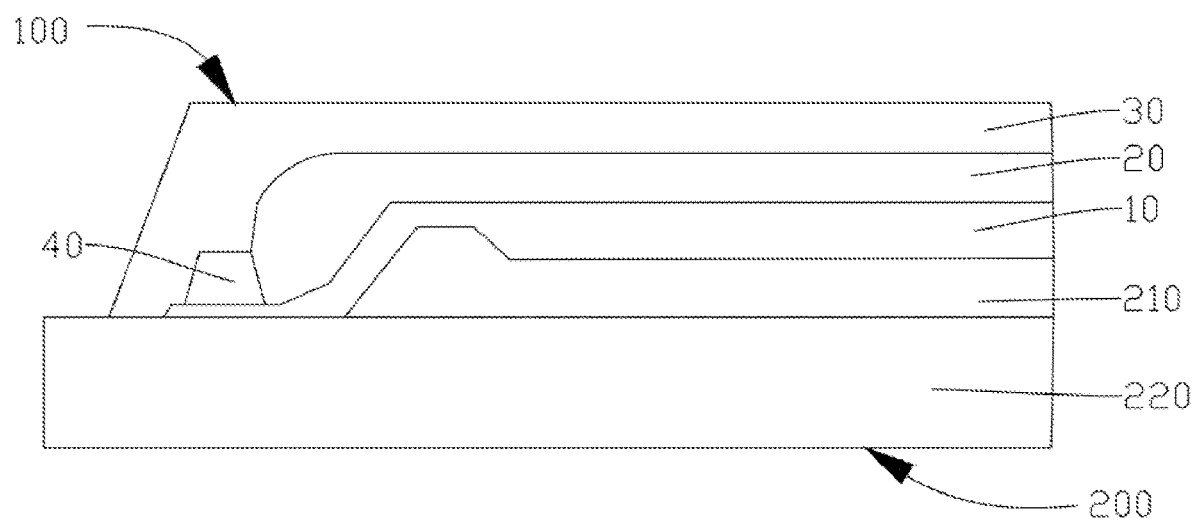
FIG. 1 is a schematic diagram of a thin-film encapsulation structure of the present invention.

Referring to the thin-film encapsulation structure 100 of FIG. 1, in the present embodiment, the thin-film encapsulation structure 100 is packaged on a display region 210 of a flexible panel 200, The display region 210 is disposed on the glass substrate 200. The thin-film encapsulation structure 100 of the present invention is sequentially laminated with a first inorganic layer 10, a first organic layer 20, and a second inorganic layer 30, wherein the first inorganic layer 10 is directly covered on and contacting with the display region 210, the first organic layer 20 is received within a first retaining wall 40.

A material of the first retaining wall 40 is hexamethyldisiloxane, and the first retaining wall 40 receives the display region 210, that is, the first retaining wall 40 and the first organic layer 20 commonly cover the first inorganic layer 10. The second inorganic layer 30 covers the first organic layer 20 and the first retaining wall 40. The first inorganic layer 10 and the second inorganic layer 30 are both used to block the erosion of external water and oxygen. Wherein the second inorganic layer 30 can also protect the first retaining wall 40 and the first organic layer 20 from erosion of external water oxygen. The first organic layer 20 is mainly used to cover the particle contaminants which are unavoidable in the production process, buffer stress in the bending and folding process in order to achieve buffering.

The first retaining wall 40 is typically prepared simultaneously with a planarization layer and a pixel definition layer in the flexible panel 200, using the same metal mask 50 to perform a deposition, Because of the material properties of the first retaining wall 40, the hydrophilic and hydrophobic of the first retaining wall 40 can be adjusted by adjusting a ratio of process gases in the chemical deposition process. When the first organic layer 20 is prepared as a hydrophilic organic material, the surface tension of the first retaining wall 40 is adjusted to be hydrophobic; when the first organic layer 20 is prepared as a hydrophobic organic material, the surface tension of the first retaining wall 40 is adjusted to be hydrophilic. Such an arrangement can prevent the outer surfaces of the first organic layer 20 and the first retaining wall 40 from being mutually dissolved due to the same hydrophilicity or the same hydrophobicity. Such an arrangement can improve the blocking efficiency of the first retaining wall 40, thereby reducing the volume and the occupied area of the first retaining wall 40, and the corresponding boundary width of the second inorganic layer 30 is also reduced in order to achieve a miniaturization of the entire thin-film encapsulation structure 100, thereby achieving a narrow frame effect of the entire flexible OLED screen.

It is to be noted that the thin-film encapsulation structure 100 described in the present invention is not limited to the above structure, and in order to obtain a better encapsulation effect, the manufacturer may continue to add protective layer on the basis of the first inorganic layer 10, the first organic layer 20 and the second inorganic layer 30, or increase other retaining walls and the like prepared by any material inside and outside of the first retaining wall 40 of the present invention. As long as the thin-film encapsulation structure includes the encapsulation structure described in the technical solution of the present invention, are all within the scope of the claimed invention.

Figure 2:
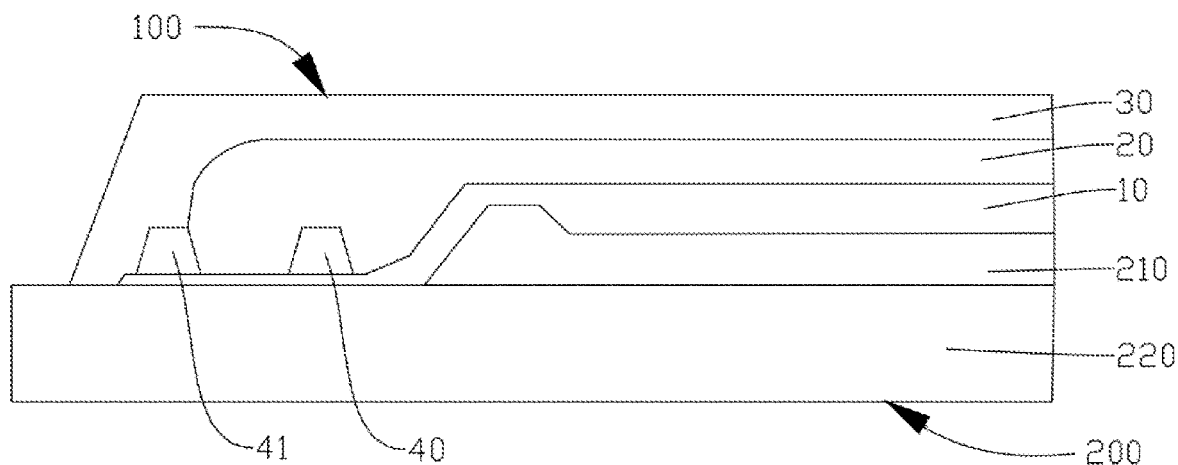
FIG. 2 is a schematic diagram of a thin-film encapsulation structure according to another embodiment of the present invention.

In another embodiment, the thin-film encapsulation structure 100 of the present invention is sequentially laminated with a first inorganic layer 10, a first organic layer 20 and a second inorganic layer 30, and at least one retaining wall for receiving the first organic layer 20. It can be understood that the at least one retaining wall may be one or multiple retaining walls. The at least one retaining wall includes a first retaining wall 40. It can be understood that when there is only one of the at least one retaining wall, the at least one retaining wall is the first retaining wall 40 (FIG. 1). When the at least one retaining wall is multiple, the at least one of the at least one retaining wall may include the first retaining wall 40 or may all be formed by the first retaining wall 40 or a third retaining wall 41 (FIG. 2) made with other material. The first organic layer 20 is received within the at least one retaining wall.

The at least one retaining wall receives the display region 210, that is, the at least one first retaining wall 40 and the first organic layer 20 commonly cover the first inorganic layer 10. The second inorganic layer 30 covers the first organic layer 20 and the at least one first retaining wall. The first inorganic layer 10 and the second inorganic layer 30 are both used to block the erosion of external water and oxygen. Wherein the second inorganic layer 30 can also protect the at least one first retaining wall 40 and the first organic layer 20 from corrosion of external water oxygen. The first organic layer 20 is mainly used to cover the particle contaminants which are unavoidable in the production process, buffer stress in the bending and folding process in order to achieve buffering.

It should be noted that, in this embodiment, the thin-film encapsulation structure 100 is disposed on the display region 210 of the flexible OLED screen 200. In actual application, the present embodiment may also be applied to a similar structure for blocking the erosion of external water and oxygen for an object to be packaged, and blocks the particle contamination, buffer stress in the bending and folding.

The first retaining wall 40 and the second inorganic layer 30 may be disposed on the first inorganic layer 10. This depends on whether the user pays more attention to the thickness control of the packaged object or more attention to the width control. In this embodiment, when the first retaining wall 40 is not disposed on the first inorganic layer 10 and is directly disposed on the glass substrate 220, the thickness of the thin-film encapsulation structure 100 can be further improved to be small, but the width of the first retaining wall 40 is necessarily greater. Conversely, when the first retaining wall 40 is disposed on the first inorganic layer 10, the overall width can be better controlled, but the corresponding thickness is increased.

For the second inorganic layer 30, since the second inorganic layer 30 has the same material and properties of the first inorganic layer 10, the second inorganic layer 30 can also block the erosion of the external water and oxygen. Accordingly, the second inorganic layer 30 can be arbitrarily disposed on the first inorganic layer 10 or above the glass substrate 220, that is, the second inorganic layer 30 is contacted with the glass substrate 220 and/or the first inorganic layer 10. Such an arrangement can ensure that the second inorganic layer 30 completely covers the at least one retaining wall and the first organic layer 20. Because many retaining walls are polymeric materials that are hygroscopic, they will cause an intrusion of lateral water vapor. If the second inorganic layer 30 can cover the at least one retaining wall, the intrusion of the lateral water vapor can be reduced.

In one embodiment, the thickness of the first inorganic layer 10 is set between 0.5 µm and 1 µm, and various deposition methods such as chemical deposition, atomic deposition, and vapor deposition may be used. The material of the first inorganic layer 10 is not limited to inorganic materials commonly used in the art such as silicon nitride, silicon oxide, silicon oxynitride or aluminum oxide, which can increase the water and oxygen blocking property of the flexible panel 100.

In one embodiment, the first organic layer 20 has a thickness of 4 µm~10 µm, and is generally prepared by an inkjet printing method. The material used for the first organic layer 20 is not limited to acrylate or hexamethyldisiloxane, polyacrylates, polycarbonates, polystyrenes, and the like, which are commonly used in the art, can buffer the stress of the flexible panel 100 during bending, folding, and coverage of particulate contaminants.

In one embodiment, the thickness of the second inorganic layer is in a range of 0.5 µm~1 µm. Like the first inorganic layer, the method of fabrication may employ a chemical deposition method, and the material used for the second organic layer 30 is not limited. An inorganic material commonly used in the art such as silicon nitride, silicon oxide, silicon oxynitride or aluminum oxide to increase the water and oxygen blocking property of the flexible panel 100 can be adopted.

In one embodiment, a thickness of the first retaining wall 40 is in a range of 0.01 µm~1 µm and a width of the first retaining wall 40 is in a range of 5 µm~50 µm, since the first retaining wall 40 is generally obtained in the preparation of a planarization layer and a pixel definition layer by a same metal mask 50, and the first retaining wall 40 cannot be defined as a completely continuous structure, otherwise the corresponding metal mask 50 cannot be fabricated. The first retaining wall 40 may be one layer, but because the retaining wall structure is not completely continuous, multiple layers may be provided to enhance the blocking effect. It should be noted that the first retaining wall 40 may be formed on the first inorganic layer 10 or may be disposed outside the first inorganic layer 10.

Figure 3:
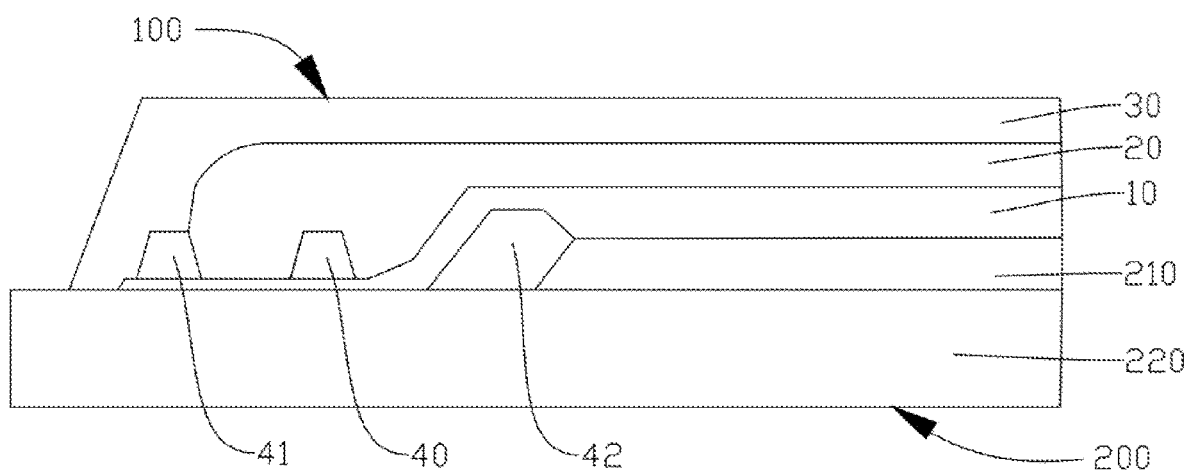
FIG. 3 is a schematic diagram of a thin-film encapsulation structure according to another embodiment of the present invention.

In one embodiment, the flexible panel 200 further includes at least one second retaining wall 42 (see FIG. 3), and the polyimide retaining wall 42 is covered by the first inorganic layer 10. The material of the second retaining wall is polyimide, the second retaining wall 42 is located in the thin-film encapsulation structure 100 of the present invention, and the second retaining wall 42 serves to reduce the pressure acted on the first retaining wall 40 and/or the third retaining wall 41.

The present invention also relates to a manufacturing method for the thin-film encapsulation structure 100 of the display region 210 of the flexible panel 200 described above. The specific technical solution is as follows:

manufacturing a first inorganic layer 10 on the flexible panel 200;

manufacturing a first retaining wall 40 on a periphery of a display region 210 of the flexible panel 200;

manufacturing a first organic layer 20 in the display region 210 of the flexible panel 200 such that the first organic layer 20 is received in a receiving cavity surrounded by the first retaining wall 40;

manufacturing a second inorganic layer 30 to cover the first retaining wall 40 and the first organic layer 20.

In the manufacturing process of the method, the thin-film encapsulation structure obtained by the above method is the thin-film encapsulation structure 100 of the present invention, and the corresponding beneficial effects of the thin-film encapsulation structure 100 of the present invention are also existed, and will not be further described herein.

Wherein, in the manufacturing of the first retaining wall 40, a chemical deposition method is employed. And controlling a gas ratio in the chemical deposition process according to hydrophilic-hydrophobic property of material of the first organic layer 20 to be printed to obtain the first retaining wall 40 having a surface with hydrophobic-hydrophilic property different from the hydrophilic/hydrophobic material. Specifically, when the material of the first organic layer 20 is hydrophilic, the surface of the first retaining wall 40 is prepared by controlling the gas ratio to make the surface of the first retaining wall 40 to be hydrophobic; when the first organic layer material is hydrophobic, controlling the gas ratio in the process of preparing the first retaining wall 40 such that the surface of the first retaining wall is hydrophilic.

It should also be noted that the manufacturing method for the thin-film encapsulation structure of the present invention is not necessarily the entire processing steps of the entire film encapsulation structure. As long as the corresponding processing steps claimed in the method of the invention are included in the process of film encapsulation, even prior to, during or after the present processing method, some conventional processing steps are added, as long as the final obtained structure is not substantial affected are all subject to the processing methods claimed herein.

In some embodiments, the first inorganic layer 10 is prepared by a deposition method, a chemical deposition method, an atomic deposition method, a vapor deposition method, or the like. The thickness of the first inorganic layer 10 is in a range of 0.5 µm~1 µm, and the material is not limited to inorganic materials commonly used in the art such as silicon nitride, silicon oxide, silicon oxynitride or aluminum oxide to increase the water and oxygen blocking resistance of the flexible panel 100.

In one embodiment, a second retaining wall 42 is formed on the flexible panel 200 before forming the first inorganic layer 10. The material of the second retaining wall 42 is polyimide, and the second retaining wall 42 serves as a first retaining wall to relieve the pressure of the first retaining wall 40.

In one embodiment, when the first retaining wall 40 is fabricated, a third retaining wall 41 made of other material can be used. The third retaining wall 41 may be disposed in the first retaining wall 40 or may be disposed outside the first retaining wall 40. At the same time, the third retaining wall needs to be covered by the inorganic layer to block the moisture. The inorganic layer may be the second inorganic layer 30 described herein, or may be another superimposed inorganic layer. The third retaining wall 41 cooperates with the second retaining wall 42 to relieve the pressure of the retaining wall of the first retaining wall 40 and achieve a better retaining wall effect.

In some embodiments, the first organic layer 20 is prepared by an inkjet printing method having a thickness of 4 µm to 10 µm, and the material used for the first organic layer 20 is not limited to acrylate or hexamethyldisiloxane, polyacrylates, polycarbonates, polystyrenes, and the like, which are commonly used in the art, can buffer the stress of the flexible panel 100 during bending, folding, and coverage of particulate contaminants.

In some embodiments, the second inorganic layer 30 is prepared by a chemical deposition method with a thickness of 0.5 µm to 1 µm, and the material used in the second organic layer 30 is not limited to silicon nitride, silicon oxide, silicon oxynitride or aluminum oxide, and the like, which is commonly used in the art to increase the water and oxygen blocking resistance of the flexible panel 100.

Figure 4:
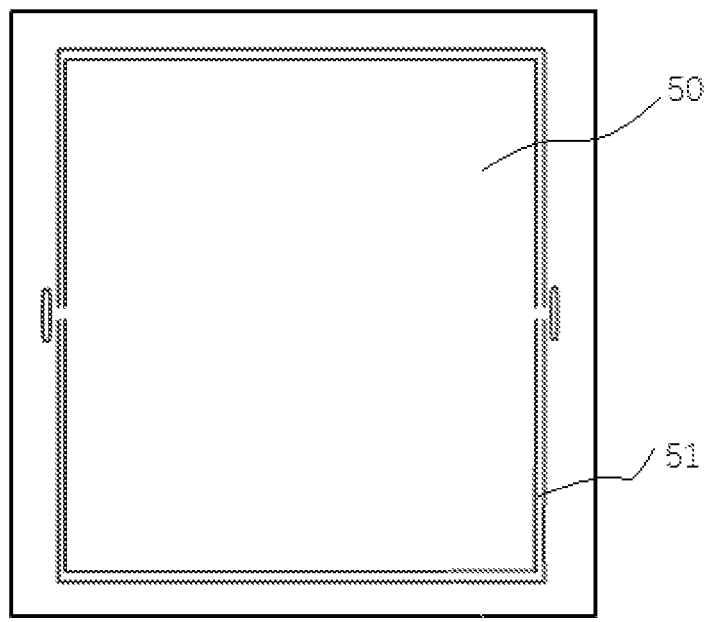
FIG. 4 is a schematic diagram of a metal mask used in the thin-film encapsulation structure of the present invention.
Figure 5:
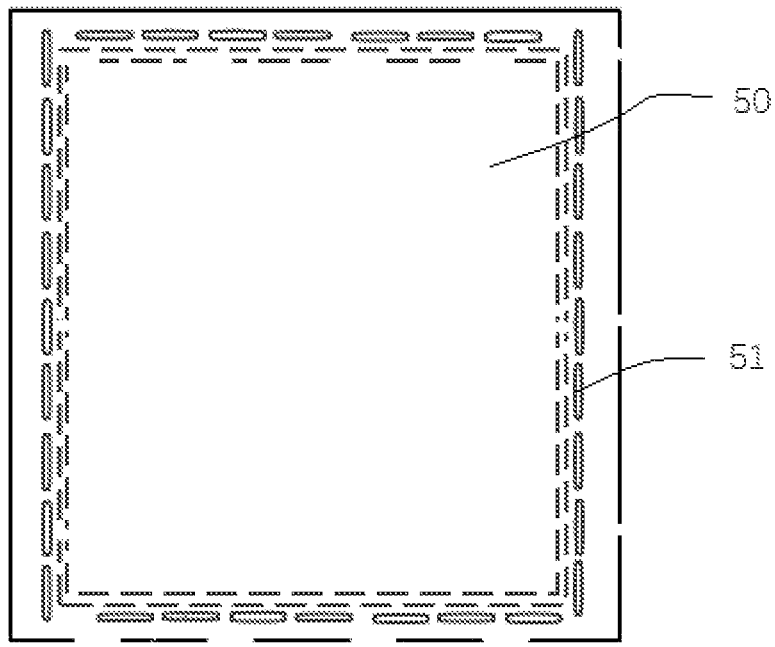
FIG. 5 is a schematic diagram of a metal mask used in the thin-film encapsulation structure of the present invention.

It is to be noted that the first retaining wall 40 has a thickness in a range of 0.01 µm and 1 µm and a width in a range of 5 µm and 50 µm, and the first retaining wall 40 is simultaneously prepared with the planarization layer and the pixel definition layer in the flexible panel. The metal mask 50 used is as shown in FIG. 4, that is, the first retaining wall 40 cannot be a completely continuous structure, otherwise the corresponding metal mask 50 cannot be manufactured. Because the first retaining wall 40 is not completely continuous, the number of layers of the retaining wall groove 51 in the metal mask 50 may be one layer or multiple layers (see FIG. 5) to improve the blocking effect of the first retaining wall 40.

The film encapsulation structure of the present invention comprises a first inorganic layer, a first organic layer and a second inorganic layer structure, wherein the first organic layer is prepared by using hexamethyldisiloxane which is an organic material to form the first retaining wall. The hydrophilicity/hydrophobicity between the first retaining wall and the first organic layer is oppositely disposed such that the surface of the first retaining wall and the first organic layer do not mutually dissolve when contacted. The feature can greatly reduce the thickness of the at least one retaining wall. At the same time, it is ensured that the flexible panel display region is shielded from external water oxygen, covering the particle contaminant of the flexible panel, buffering the stress during bending and folding. Compared with the traditional retaining wall structure, it has more simplified and more reliable features. The thin film encapsulation structure manufactured by the method of the present invention helps to further narrow the frame of the flexible OLED screen display region and improve the user experience because of the miniaturization of the volume.

The above embodiment does not constitute a limitation of the scope of protection of the present technology solution. Any modifications, equivalent replacements and improvements based on the spirit and principles of the above embodiments should also be included in the protection scope of the present technology solution.

What is claimed is:

1. A thin-film encapsulation structure of a flexible panel, comprising:
    a first inorganic layer, a first organic layer, and a second inorganic layer which are sequentially laminated; and
    a first retaining wall;
    wherein the first inorganic layer covers on the flexible panel;
    wherein the number of the first retaining wall is at least one, the first retaining wall is made of hexamethyldisiloxane, and the at least one first retaining wall is disposed at a peripheral of the first organic layer; and
    wherein the second inorganic layer covers the first organic layer and the first retaining wall;
    wherein when the first organic layer is a hydrophilic material, a surface of the first retaining wall is hydrophobic; and when the first organic layer is a hydrophobic material, a surface of the first retaining wall is hydrophilic.

2. The thin-film encapsulation structure of a flexible panel according to claim 1, wherein the first retaining wall is disposed on the first inorganic layer.

3. The thin-film encapsulation structure of a flexible panel according to claim 2, wherein the second inorganic layer and the first inorganic layer are contacted.

4. The thin-film encapsulation structure of a flexible panel according to claim 3, wherein the flexible panel further includes at least one second retaining wall, a material of the second retaining wall is polyimide and the second retaining wall is covered by the first inorganic layer.

5. The thin-film encapsulation structure of a flexible panel according to claim 2, wherein the flexible panel further includes at least one second retaining wall, a material of the second retaining wall is polyimide and the second retaining wall is covered by the first inorganic layer.

6. The thin-film encapsulation structure of a flexible panel according to claim 1, wherein the flexible panel further includes at least one second retaining wall, a material of the second retaining wall is polyimide and the second retaining wall is covered by the first inorganic layer.

* * * * *